United States Patent
van de Veerdonk et al.

(10) Patent No.: US 9,638,995 B2
(45) Date of Patent: May 2, 2017

(54) METHOD OF SHEARED GUIDING PATTERNS

(71) Applicant: Seagate Technology LLC, Cupertino, CA (US)

(72) Inventors: René van de Veerdonk, Pleasanton, CA (US); XiaoMin Yang, Livermore, CA (US); Kim Lee, Fremont, CA (US); Justin Hwu, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 433 days.

(21) Appl. No.: 14/199,889

(22) Filed: Mar. 6, 2014

(65) Prior Publication Data

US 2014/0265025 A1    Sep. 18, 2014

Related U.S. Application Data

(60) Provisional application No. 61/778,361, filed on Mar. 12, 2013, provisional application No. 61/778,364, filed on Mar. 12, 2013.

(51) Int. Cl.
*G03F 7/00* (2006.01)
*B82Y 10/00* (2011.01)
*G11B 5/74* (2006.01)
*G11B 5/855* (2006.01)

(52) U.S. Cl.
CPC ............ *G03F 7/0002* (2013.01); *B82Y 10/00* (2013.01); *G11B 5/746* (2013.01); *G11B 5/855* (2013.01)

(58) Field of Classification Search
CPC ..................................................... G03F 7/0002
See application file for complete search history.

(56) References Cited

U.S. PATENT DOCUMENTS

| | | |
|---|---|---|
| 4,704,433 A | 11/1987 | Ueki et al. |
| 4,705,830 A | 11/1987 | Makishima et al. |
| 6,090,911 A | 7/2000 | Petka et al. |
| 2012/0135159 A1* | 5/2012 | Xiao ................... B81C 1/00031 427/534 |

* cited by examiner

*Primary Examiner* — Timothy Kennedy

(57) ABSTRACT

The embodiments disclose a method including depositing a resist layer using a mixture of several different length polymer strings materials spanning a range of natural periodicity, and imprinting the mixture of several different length polymer strings using sheared guiding patterns to increase flexibility.

10 Claims, 11 Drawing Sheets

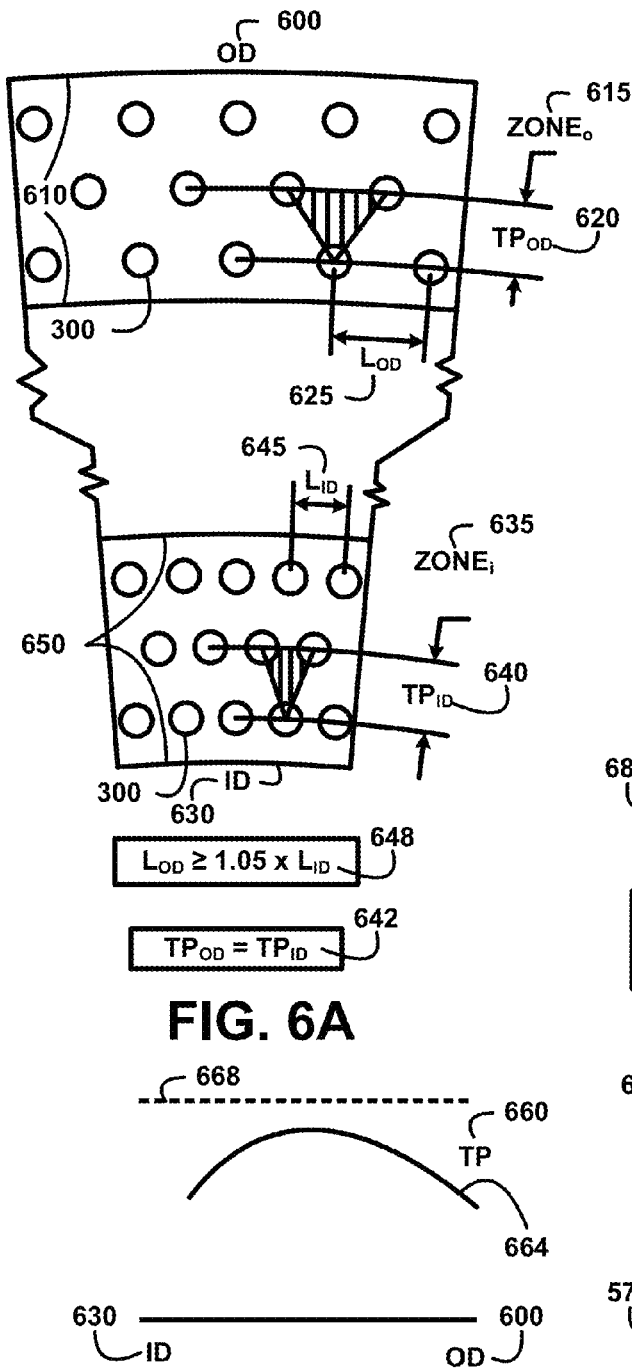
FIG. 6A
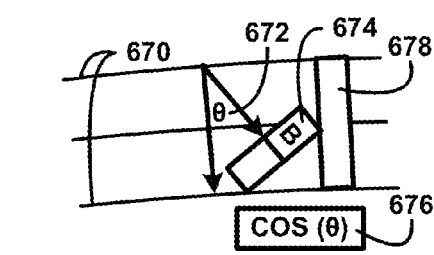
FIG. 6B
FIG. 6C
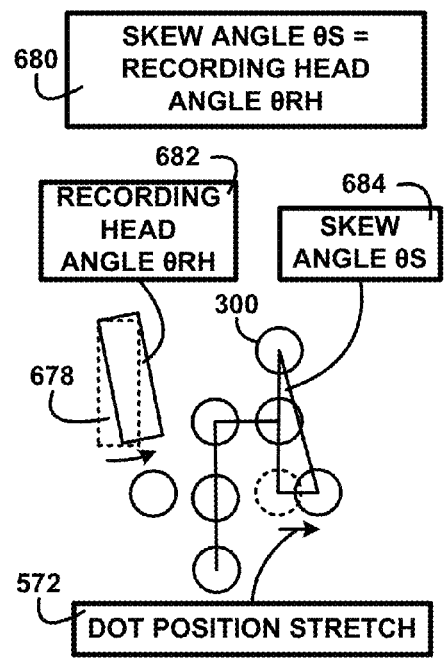
FIG. 6D

METHOD OF SHEARED GUIDING PATTERNS

CROSS-REFERENCE TO RELATED APPLICATIONS

This application is based on U.S. Provisional Patent Application Ser. No. 61/778,361 filed Mar. 12, 2013, entitled "A METHOD OF DELIBERATE NONMONODISPERSITY OF BLOCK-COPOLYMER MIXTURES", by First Named Inventor René van de Veerdonk, et al. and U.S. Provisional Patent Application Ser. No. 61/778,364, filed on Mar. 12, 2013, entitled "A METHOD OF ZONED TRACK-WIDTH MODULATION"", by First Named Inventor René van de Veerdonk, et al.

BRIEF DESCRIPTION OF THE DRAWINGS

FIG. 6A shows for illustrative purposes only an example of dot compressing and stretching at the same time of one embodiment.

FIG. 6B shows for illustrative purposes only an example of skew angles of one embodiment.

FIG. 6C shows for illustrative purposes only an example of circular symmetry in down track stretching of one embodiment.

FIG. 6D shows for illustrative purposes only an example of recording head angles of one embodiment.

DETAILED DESCRIPTION OF THE INVENTION

Figure 1:
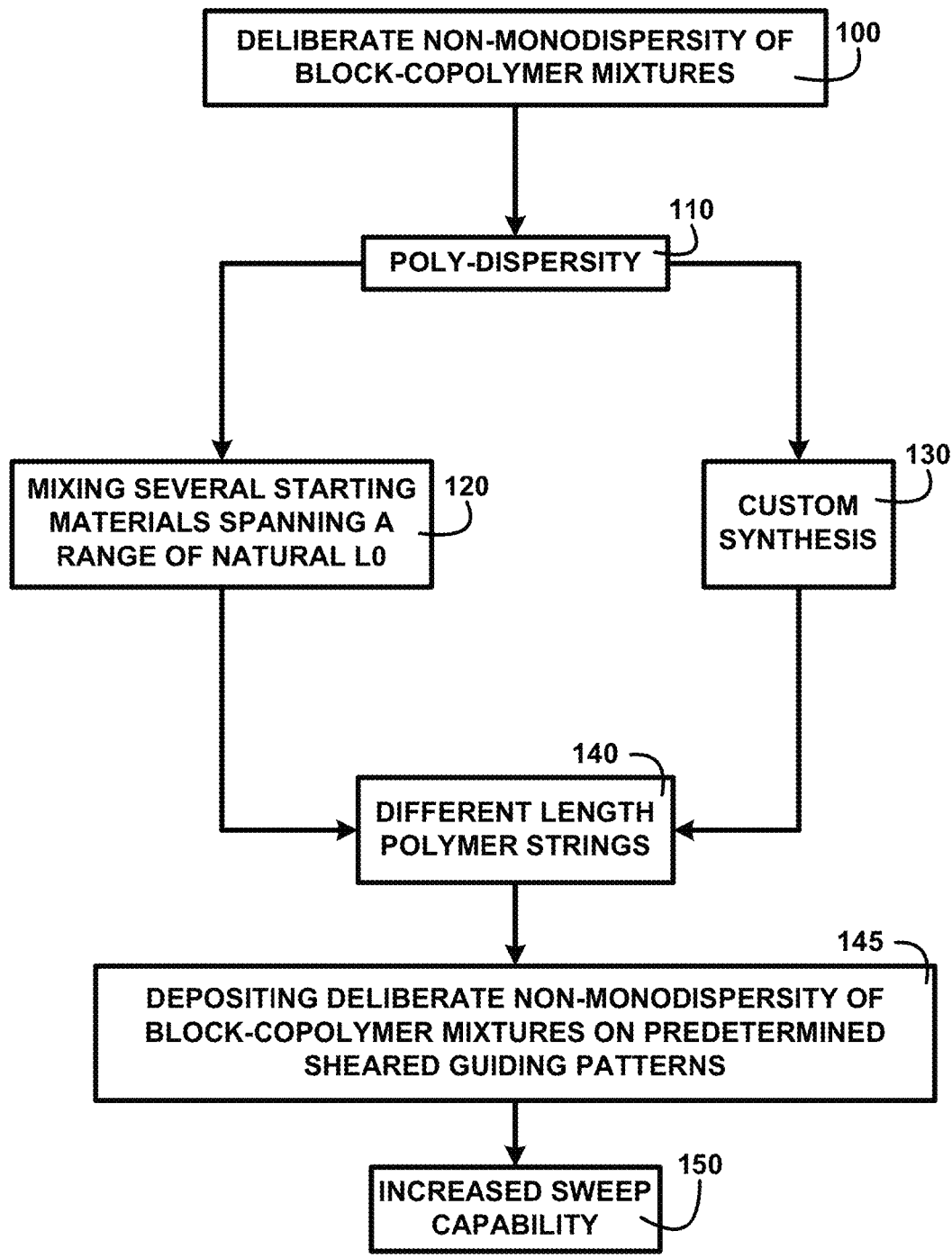
FIG. 1 shows a block diagram of an overview of a method of sheared guiding patterns of one embodiment.

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview

It should be noted that the descriptions that follow, for example, in terms of a method of sheared guiding patterns is described for illustrative purposes and the underlying system can apply to any number and multiple types block-copolymer mixtures. In one embodiment of the present invention, the method of sheared guiding patterns can be configured using polymer chains, or "strings", in the BCP that are not the same length. The method of sheared guiding patterns can be configured to include sphere-forming BCP materials and can be configured including cylinder-forming and lamellar-forming BCP materials using the present invention.

Bit Patterned Media (BPM) is a recording system that relies on fabricating arrays of well-defined islands on the disk surface. The generally endorsed approach for this process relies on a Directed Self-Assembly (DSA) step using block-copolymer (BCP) materials. These materials self-organize into regular structures with hexagonal or square symmetry and an equilibrium pitch $L_O$. It is generally accepted that by purifying the starting BCP materials, i.e., reducing the poly-dispersity, it is possible to improve on the size distribution of the spherical, cylindrical, or lamellar characteristic size distribution as well as the extent of their natural long range order (as measured without guiding structure). Both these properties are desirable for magnetic recording applications.

For application in a disk-drive recording system, however, these regular patterns bend in a circular symmetry to accommodate the skew of the recording head as it pivots from the inner to outer radius of the addressable surface. One way to accomplished this is by providing a guiding structure that contorts the local symmetry. For instance, it is possible to stretch or compress the down-track pitch to ensure a fixed number of dots for a full circumference. At least within a single recording zone, spanning from an inner-radius R (ID,i) to an outer-radius R(OD,i), this provides individual island addressability. At the zone transitions, the number of dots per circumference can be reset to maintain a quasi-constant areal density across the stroke. Similarly, a shearing deformation can be employed to follow the skew.

However, distortions are determined in scope by the physical properties of the BCP materials. For practical materials systems, it is found that 5% stretch or compression and/or 7 degrees of skew are the upper range before large scale defective regions become prevalent. These numbers are typical, in the sense that they have been reported for various materials systems and guiding techniques. In particular, this is not enough to accommodate the 18 degrees of skew seen in a conventional disk-drive design. The upper range of stretch or compression and, more particularly, the upper range of sweep capability of this fabrication methodology impose severe constraints on the overall recording system design and its achievable performance.

Observing a top-view of the desired patterns, it can be seen that not all the strings in the BCP are the same length. For instance, the shortest strings span the distance between the centers of two nearest neighbor domains ($2L_O$). The strings spanning that same direction, but filling in the region near the substrate and surface are significantly longer ($22L_O$ this effect is particularly significant for sphere-forming BCP materials and less significant for lamellar-forming BCP materials), as are the in-plane distances in the direction of the next-nearest neighboring domains ($23L_O$). Whereas these considerations apply even in the perfectly length-matched symmetric patterns, for sheared or stretched guiding patterns additional deliberate length-variations are introduced. Therefore, a range of BCP string-lengths may be desired to match the variation expected based on the desired patterns.

FIG. 1 shows a block diagram of an overview of a method of sheared guiding patterns of one embodiment. FIG. 1 shows using deliberate non-monodispersity of block-copolymer mixtures 100 to create poly-dispersity 110. The poly-dispersity 110 is achieved by mixing several starting materials spanning a range of natural $L_O$ 120. The materials include materials created by custom synthesis 130. The deliberate non-monodispersity of block-copolymer mixtures 100 includes different length polymer strings 140. The different length polymer strings 140 expand or increase the spacing between features created during block-copolymer (BCP) self-assembly. The increased spacing between features is predetermined by the deliberate non-monodispersity of block-copolymer mixtures 100.

The DSA is initiated by depositing deliberate non-monodispersity of block-copolymer mixtures on predetermined sheared guiding patterns 145. The poly-dispersity 110 creates increased sweep capability 150 that conforms to the predetermined sheared guiding patterns. The increased sweep capability 150 is used for application in fabricating for example a disk-drive recording system.

Regular patterns bend in a circular symmetry to accommodate the skew of the recording head as it pivots from the inner to outer radius of the addressable surface. The method of sheared guiding patterns creates more flexibility in achieving the skewing and stretching of feature pattern position to create circular symmetry that matches skewing of a recording head as it pivots of one embodiment.

Therefore the embodiments feature predetermined poly-dispersity that conform to predetermined sheared guiding patterns. This can be done on-purpose by mixing several starting materials spanning a range of natural $L_O$ or by custom synthesis. The availability of different length polymer strings in the spin-coated resist makes the edges of the phase-separation boundary fuzzy, and it is expected that this increased flexibility will allow the BCP material to more easily conform to the guiding pattern, in particular, to the sheared guiding patterns. The increased sweep capability greatly relieves the overall system design constraints. The embodiment in the pattern stretch and skew-ability is balanced by for size and position accuracy.

Figure 2:
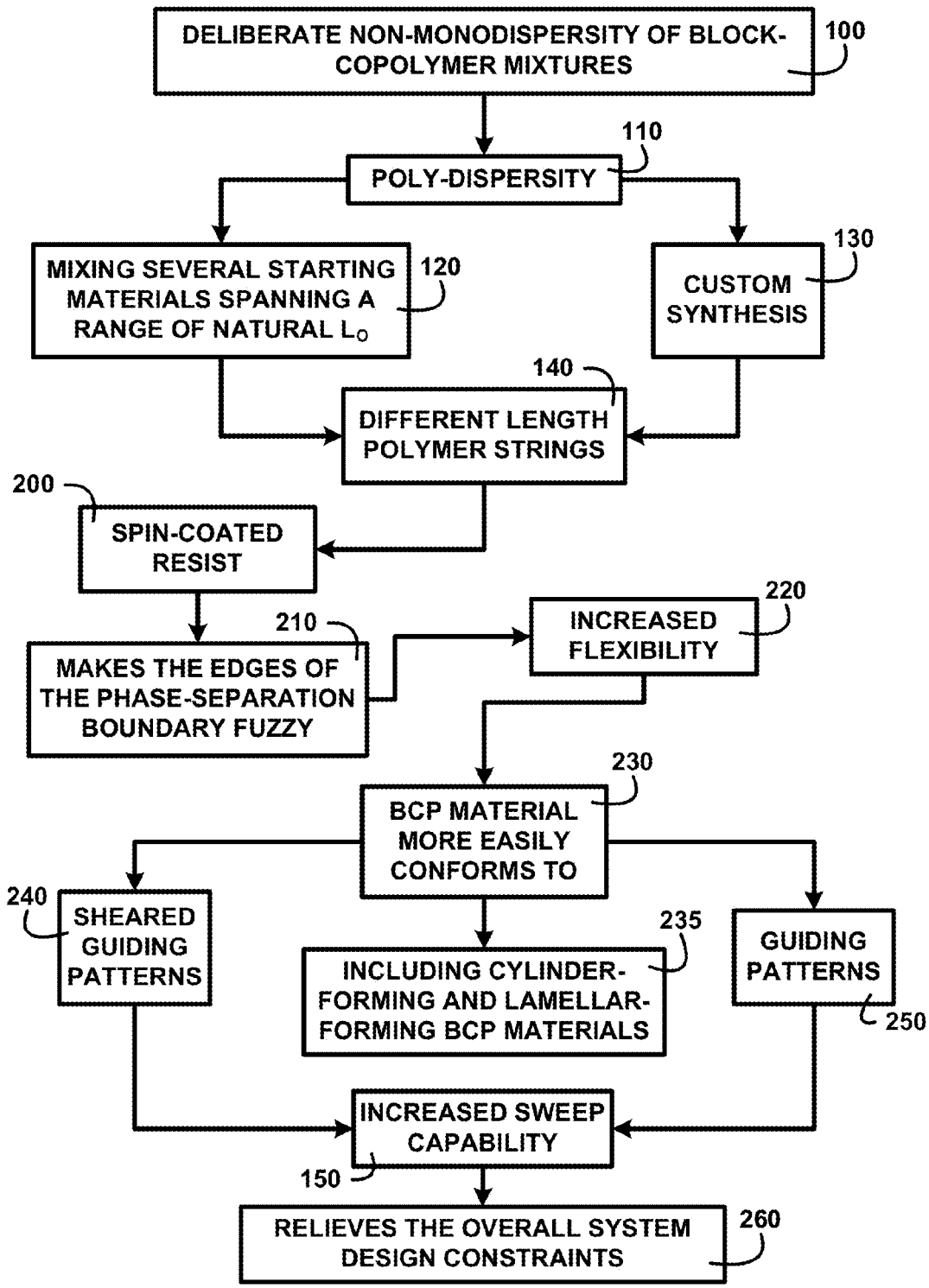
FIG. 2 shows a block diagram of an overview flow chart of a method of sheared guiding patterns of one embodiment.

FIG. 2 shows a block diagram of an overview flow chart of a method of sheared guiding patterns of one embodiment. FIG. 2 shows a deliberate non-monodispersity of block-copolymer mixtures 100. The poly-dispersity 110 created by mixing several starting materials spanning a range of natural $L_O$ 120. Custom synthesis 130 is used to make different length polymer strings 140. Spin-coated resist 200 makes the edges of the phase-separation boundary fuzzy 210. The use of deliberate non-monodispersity of block-copolymer mixtures 100 creates increased flexibility 220 in the patterning of features.

BCP material more easily conforms to 230 sheared guiding patterns 240 and guiding patterns 250 by increased sweep capability 150 including cylinder-forming and lamellar-forming BCP materials 235. The increased sweep capability 150 using deliberate non-monodispersity of block-copolymer mixtures 100 relieves the overall system design constraints 260 of one embodiment.

Figure 3:
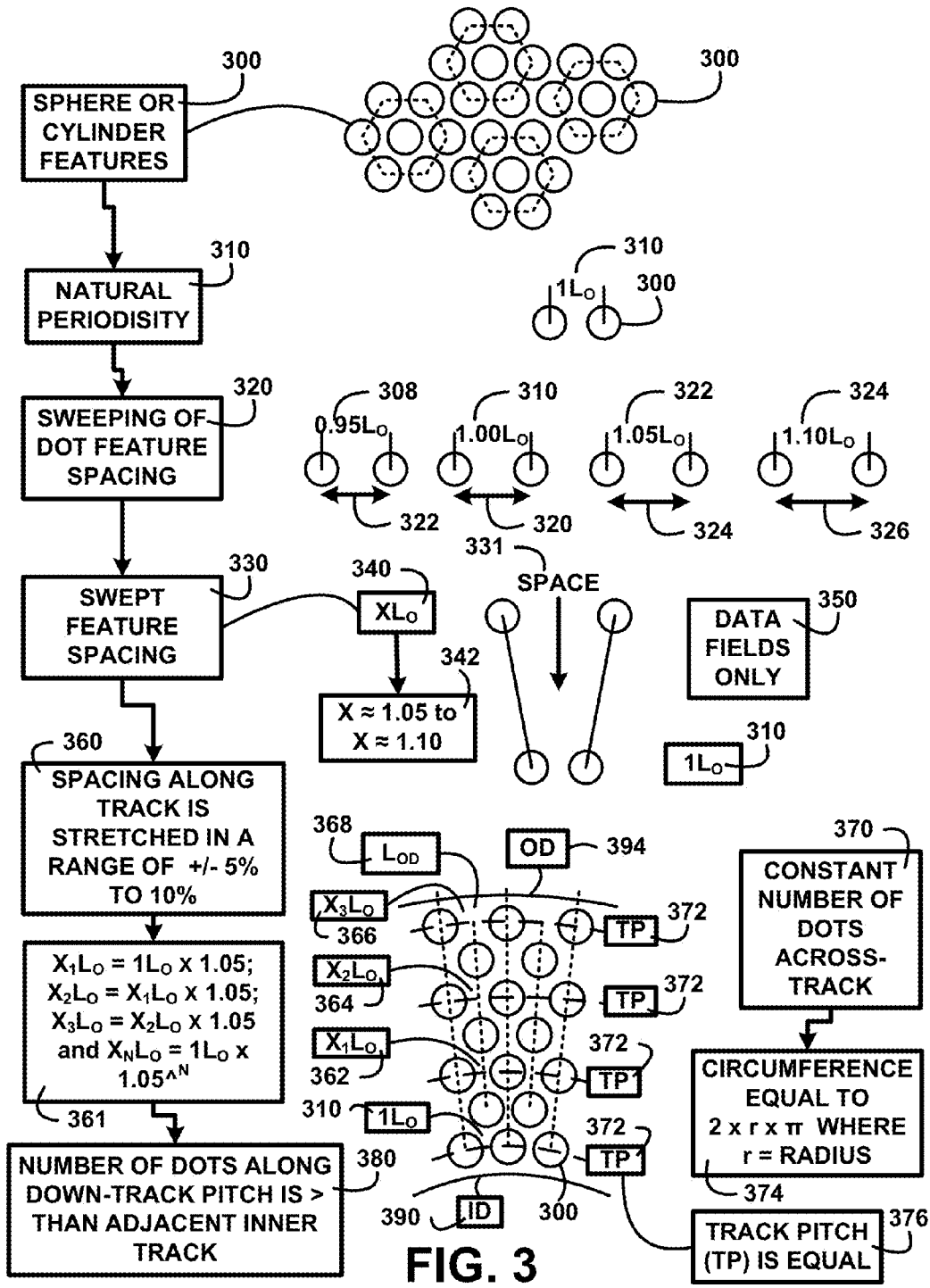
FIG. 3 shows for illustrative purposes only an example of calculating sweep spacing of one embodiment.

FIG. 3 shows for illustrative purposes only an example of calculating skew spacing of one embodiment. FIG. 3 shows sphere or cylinder features 300 including features in hexagonal patterns. The sphere or cylinder features 300 have a natural periodicity 310 created by the polymer string length of the polymers used in the BCP for self-assembly. The method of sheared guiding patterns is used for sweeping of dot feature spacing 320. The sweeping of dot feature spacing 320 is used to increase the periodicity from the natural periodicity 0.95 $L_O$ 308 to 1.00$L_O$ 310 to 1.05$L_O$ 322 to 1.10$L_O$ 324. The increase of the periodicity distance separating features includes periodicity lower than distance 320 of 1.00$L_O$ 310 including distance 322 of 0.95$L_O$ 308 and increases greater than distance 320 including distance 324 and distance 326.

Swept feature spacing 330 is represented by $XL_O$ 340 and increases the space 331 between features from the natural spacing 1$L_O$ 310. The swept feature spacing 330 is $XL_O$ 340 where X≈1.05 to X≈1.10 342.

Spacing along track is stretched in a range of +/−5% to 10% 360 where $X_1L_O$=1$L_O$×1.05; $X_2L_O$=$X_1L_O$×1.05; $X_3L_O$=$X_2L_O$×1.05 361. Swept spacing $X_1L_O$ 362, $X_2L_O$ 364 and $X_3L_O$ 366 increases the space between features greater than 1$L_O$ 310 as seen in the radial dotted lines running through the features. The spacing $L_{OD}$ 368 is greater than the spacing at the ID 390 than that at the OD 394.

A number of dots along down-track pitch is >than adjacent inner track 380. The length along or down-track is a circumference equal to 2×r×π where r=radius 374. The track pitch TP 372 is the distance separating tracks in a cross-track direction. As shown in FIG. 3 track pitch (TP) is equal 376. A constant number of dots across-track 370 is seen of one embodiment.

Figure 4:
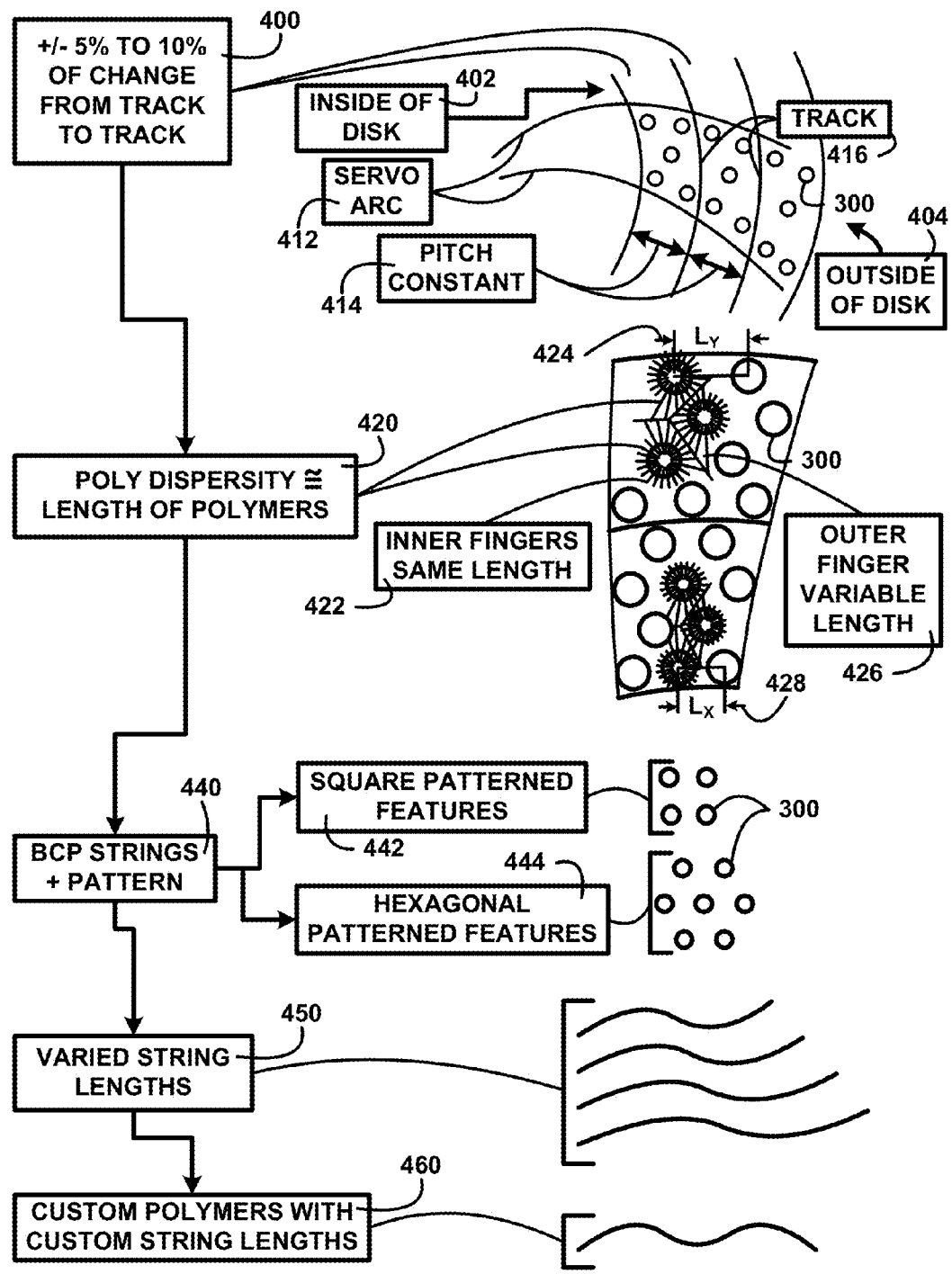
FIG. 4 shows for illustrative purposes only an example of poly dispersity length of polymers of one embodiment.

FIG. 4 shows for illustrative purposes only an example of poly dispersity length of polymers of one embodiment. FIG. 4 shows a +/−5% to 10% of change from track to track 400 from inside of disk 402 to outside of disk 404. The sphere or cylinder features 300 follow the servo arc 412 across track with a pitch constant 414. The +/−5% to 10% of change in each track 416 is a sweep of feature spacing down track of the sphere or cylinder features 300 created using poly dispersity≅length of polymers 420. The length of polymers are varied where inner fingers same length 422 and outer finger variable length 426 create the spacing of features during BCP self-assembly. The poly dispersity≅length of polymers 420 creates mixed feature spacing including Lx 428 closer to the inside of disk 402 and Ly 424 to outside of disk 404.

The BCP strings+pattern 440 are used to create sphere or cylinder features 300 including square patterned features 442 and hexagonal patterned features 444. The poly dispersity≅length of polymers 420 includes varied string lengths 450 and custom polymers with custom string lengths 460 of one embodiment.

Figure 5:
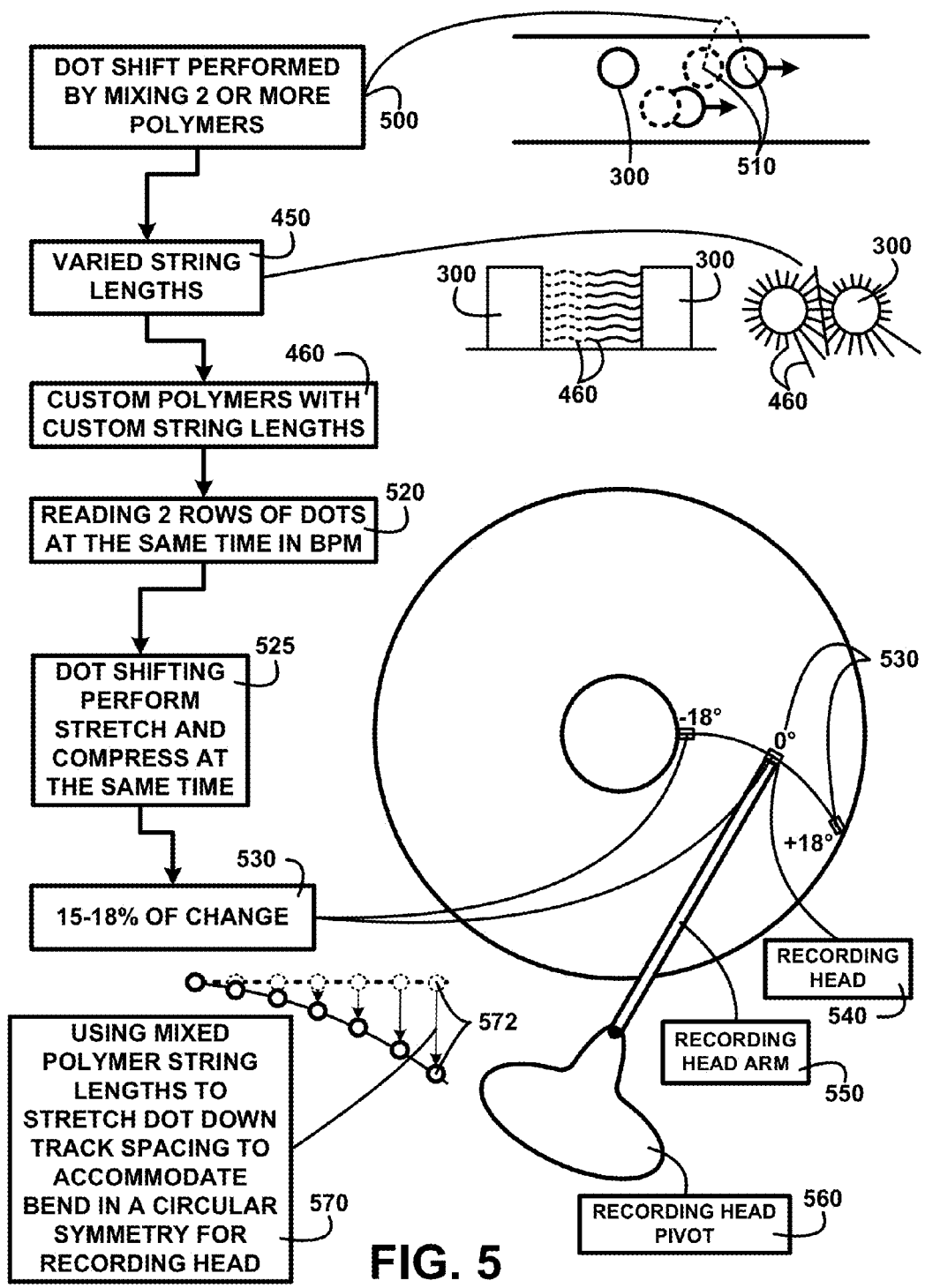
FIG. 5 shows for illustrative purposes only an example of stretching dot down track spacing of one embodiment.

FIG. 5 shows for illustrative purposes only an example of stretching dot down track spacing of one embodiment. FIG. 5 shows a dot shift performed by mixing 2 or more polymers 500. A dot shift 510 occurs during a BCP self-assembly. The formation of sphere or cylinder features 300 is spaced apart using the varied string lengths 450 including custom polymers with custom string lengths 460. The varied string lengths 450 skew the positions of the sphere or cylinder features 300 during formations from and inner diameter to an outer diameter.

A read head is reading 2 rows of dots at the same time in BPM 520. The polymers with varied string lengths 450 create a function wherein dot shifting perform stretch and compress at the same time 525. Dot shifting is predetermined to create a 15-18% of change 530 in dot positions to match the angular changes in the arc path of a recording head 540.

The recording head 540 is shown in three locations along its circular path of travel over the disk surface. The circular arc it travels is due to the movement of the recording head 540 attached to a recording head arm 550 which in turn is attached to a recording head pivot 560. The method of sheared guiding patterns is using mixed polymer string lengths to stretch dot down track spacing to accommodate bend in a circular symmetry for recording head 570 of one embodiment.

FIG. 6A shows for illustrative purposes only an example of dot skewing and stretching at the same time of one embodiment. FIG. 6A shows an outer diameter OD 600 of a disk. Positioned along the OD 600 is an outer track 610. Within the outer track 610 is Zone$_O$ 615. Zone$_O$ 615 has a track pitch TP$_{OD}$ 620. Correspondingly FIG. 6A shows an inner diameter ID 630 of the same disk.

Positioned along the ID 630 is an inner track 650. Within the inner track 650 is Zone$_i$ 635. Zone$_i$ 635 has a track pitch TP$_{ID}$ 640. TP$_{OD}$=TP$_{ID}$ 642 indicating that the spacing of the tracks is the same from the ID 630 to the OD 600. FIG. 6A shows that the skew and stretch of the sphere or cylinder features 300 along Zone$_O$ 615 is L$_{OD}$ 625 and the sphere or cylinder features 300 along Zone$_i$ 635 is L$_{ID}$ 645. L$_{OD}$≥1.05×L$_{ID}$ 648 of one embodiment.

FIG. 6B shows for illustrative purposes only an example of skew angles of one embodiment. FIG. 6B shows a track 670 within which a recording head 678 is traveling. A distance equal to cos (θ) 676 is a stretch distance of the sphere or cylinder features 300 of FIG. 3 position represented here by B 674. The B 674 position is stretched a distance determined by angle θ 672 to match the recording head 678 position angle at the track 670 in which B 674 is located of one embodiment.

FIG. 6C shows for illustrative purposes only an example of circular symmetry in down track stretching of one embodiment. FIG. 6C shows a plot of the circular arc recording head angle as it travels along a progression of disk radius 668 from the ID 630 to the OD 600. The TP 660 is constant starting from the ID 630 and adds to the circular symmetry 664 of the recording head angle.

FIG. 6D shows for illustrative purposes only an example of recording head angles of one embodiment. FIG. 6D shows a group of sphere or cylinder features 300. A skew angle θS 680=recording head angle θRH to create the circular symmetry between the feature positions and the circular path traveled by the recording head as it pivots. A recording head angle θRH 682 changes as the recording head travels across the surface of the disk in its circular arc. The skew angle θS 684 is predetermined to match the recording head angle θRH 682 in tracks moving from the inner diameter radius to the outer diameter radius. The recording head 678 position as it pivots is accounted for using the dot position stretch 572 in addition to the skew angle θS 684 of one embodiment.

Figure 7:
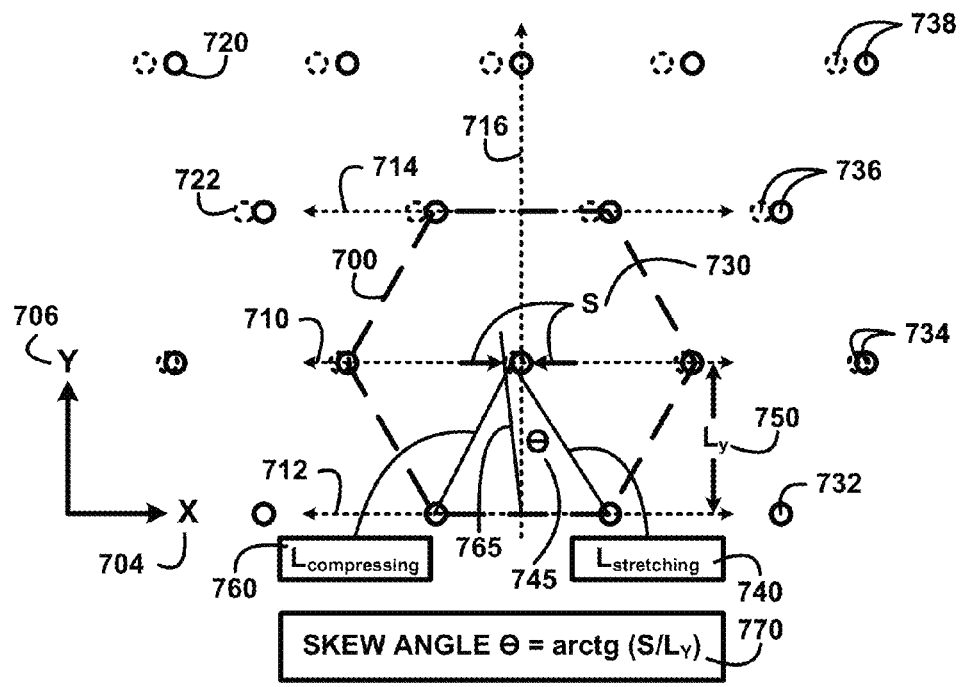
FIG. 7 shows for illustrative purposes only an example of compression and stretching of hexagonal patterned features of one embodiment.

FIG. 7 shows for illustrative purposes only an example of compression and stretching of hexagonal patterned features of one embodiment. FIG. 7 shows a hexagonal pattern 700 of non-compressed and non-stretched patterned features 720 and skewed patterned features 722 in a gradual shift of position relative to the non-compressed and non-stretched patterned features 720 relative position created using compression and stretching made possible by using the method of sheared guiding patterns.

In down track alignments 712, 710 and 714 the shift of relative position is stretched a greater distance S 730 as the down track alignment 710 is farther from down track alignment 712 and down track alignment 714 is farther from down track alignment 710. The shifting positions are created using the block-copolymer mixtures configured using polymer chains, or "strings", in the BCP that are not the same length. The shifted positions are based on predetermined mixtures that create angular repositioning based on an L$_{stretching}$ 740 and L$_{compressing}$ 760. The L$_{stretching}$ 740 and L$_{compressing}$ 760 changing angles adjust the value of L$_y$ 750 the cross-track separation distance in a compression process. In the down-track shifting the lengthening values of S 730 are shown in the greater stretching from patterned feature 732 to patterned feature 734 and likewise with patterned features 736, 738. The adjustments in the compression in the cross-track direction Y 706 and stretching in the down-track direction X 704 create a skew angle θ=arctg (S/Ly) 770. The skew angle θ 745 is relative to the perpendicular cross-track direction Y 706 alignment through patterned features as shown in alignment 716 of one embodiment.

Figure 8:
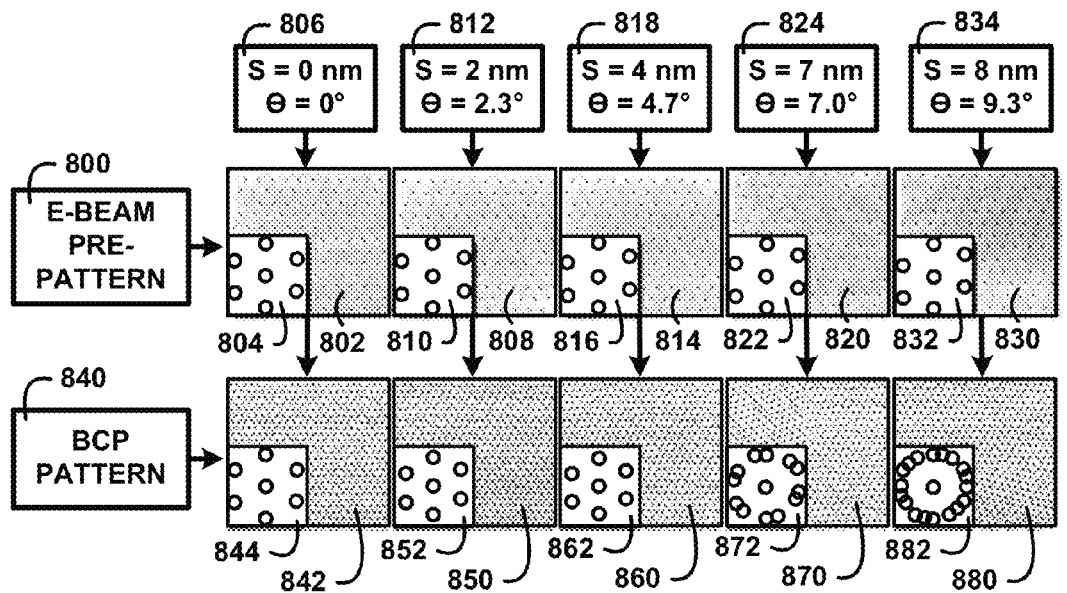
FIG. 8 shows for illustrative purposes only an example of compression and stretching of hexagonal patterned features using deliberate non-monodispersity of block-copolymer of one embodiment.

FIG. 8 shows for illustrative purposes only an example of compression and stretching of hexagonal patterned features using deliberate non-monodispersity of block-copolymer of one embodiment. FIG. 8 shows a series of slides of e-beam pre-pattern 800 etched guiding patterns used for guiding BCP self-assembly. Slide 802 shows the hexagonal pattern 804 that is created using a stretch dimension S=0 nm and a skew angle θ=0° 806. Slide 808 shows the hexagonal pattern 810 that is created using a stretch dimension S=2 nm and a skew angle θ=2.3° 812. Slide 814 shows the hexagonal pattern 816 that is created using a stretch dimension S=4 nm and a skew angle θ=4.7° 818. Slide 820 shows the hexagonal pattern 822 that is created using a stretch dimension S=7 nm and a skew angle θ=7.0° 824. Slide 830 shows the hexagonal pattern 832 that is created using a stretch dimension S=8 nm and a skew angle θ=9.3° 834.

The e-beam pre-pattern 800 guides the self-assembly of the BCP pattern 840 in gradual changes in compression and stretching in track domains expanding radially from the center of a disk. Slide 842 shows the BCP pattern 840 hexagonal pattern 844 created using the stretch dimension S=0 nm and a skew angle θ=0° 806 guidance.

Slide 850 shows the BCP pattern 840 hexagonal pattern 852 created using the stretch dimension S=2 nm and a skew angle θ=2.3° 812 guidance. Slide 860 shows the BCP pattern 840 hexagonal pattern 862 created using the stretch dimension S=4 nm and a skew angle θ=4.7° 818 guidance. Slide 870 shows the BCP pattern 840 hexagonal pattern 872 created using the stretch dimension S=7 nm and a skew angle θ=7.0° 824 guidance. Slide 880 shows the BCP pattern 840 hexagonal pattern 882 created using the stretch dimension S=8 nm and a skew angle θ=9.3° 834 guidance.

The use of e-beam pre-pattern 800 etched guiding patterns used for guiding BCP self-assembly including predetermined compression and stretching of patterned feature positions allows increased flexibility 220 of FIG. 2 in fabrication patterned stack that are not constrained. The deliberate non-monodispersity of block-copolymer mixtures BCP material more easily conforms to 230 of FIG. 2 sheared guiding patterns 240 of FIG. 2 and guiding patterns 250 of FIG. 2 of one embodiment.

Figure 9:
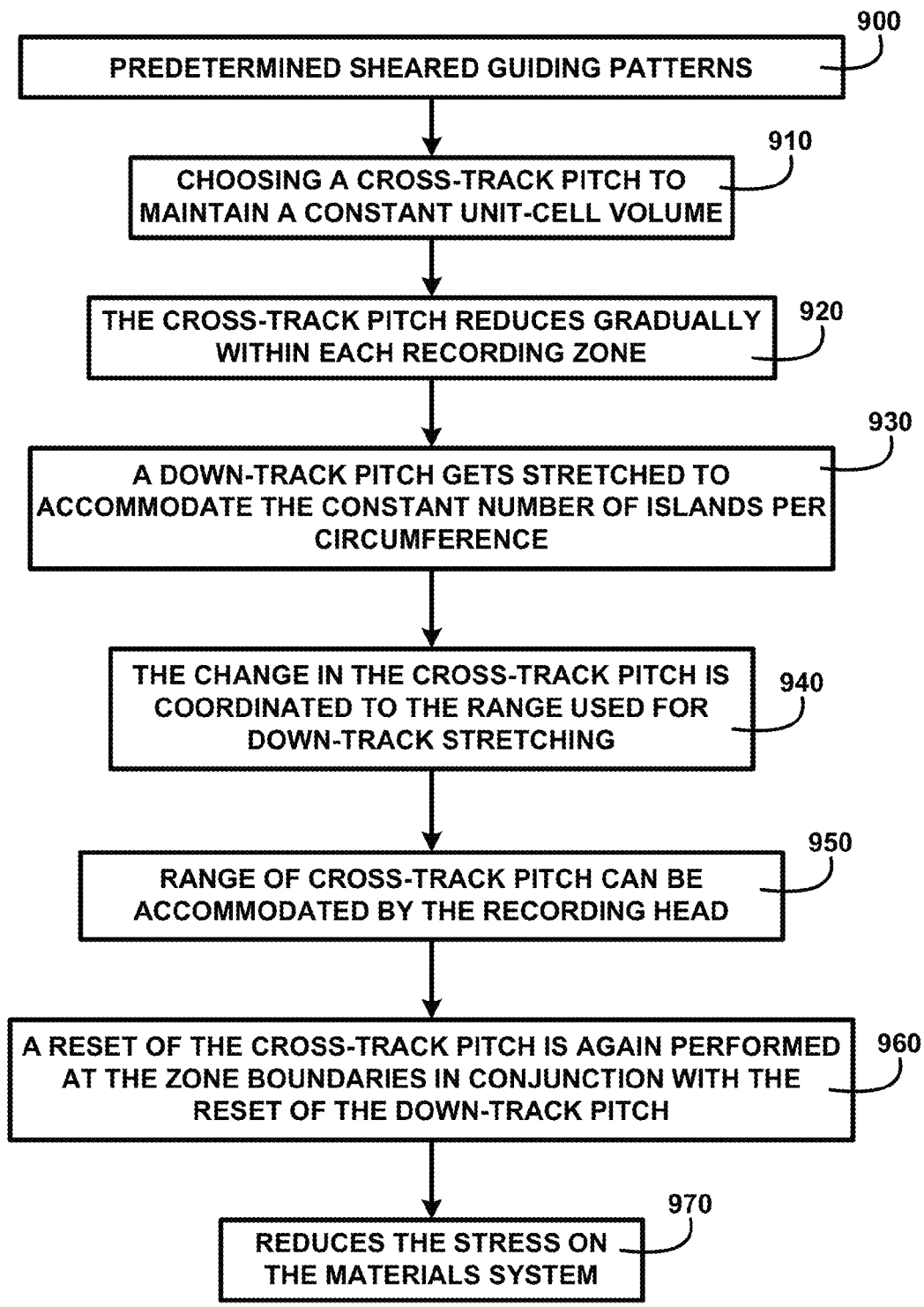
FIG. 9 shows a block diagram of an overview of a predetermined sheared guiding pattern of one embodiment.

FIG. 9 shows a block diagram of an overview of a predetermined sheared guiding pattern of one embodiment. FIG. 9 shows predetermined guiding patterns 900. The predetermined sheared guiding patterns 900 are used for choosing a cross-track pitch to maintain a constant unit-cell volume 910. Unit-cell volume is a triangular area that lies between two adjacent down-track patterned features and the adjacent patterned feature in the cross-track direction that is between the first two features. The cross-track pitch reduces gradually within each recording zone 920.

A down-track pitch gets stretched to accommodate the constant number of islands per circumference 930. Islands are patterned features. The change in the cross-track pitch is coordinated to the range used for down-track stretching 940. The predetermined coordination of cross-track pitch and down-track stretching maintains the constant unit-cell volume. A range of cross-track pitch can be accommodated by the recording head 950. A reset of the cross-track pitch is again performed at the zone boundaries in conjunction with the reset of the down-track pitch 960. The predetermined coordinated setting of cross-track pitch and down-track stretching reduces the stress on the materials system 970. Stress on the materials systems occurs when for example the distances of block-copolymer directed self-assembly to following guiding patterns are greater than the natural periodicity of the self-assembly. This causes defective features shapes and errant feature placements. This constant volume approach also helps the quality of related process steps where constant pattern density is desired, for example resist dispensing and planarization. The predetermined coordinated setting of cross-track pitch and down-track stretching maintains a constant unit-cell volume that is suited to the block-copolymer materials used in the directed self-assembly. The coordinated constant unit-cell volume of the sheared guiding patterns extends the radial range of defect free block-copolymer conformance to guiding patterns.

Bit Patterned Media is a novel recording system solution that relies on fabricating arrays of defined islands on the disk surface. The generally endorsed approach for this process relies on a Directed Self-Assembly (DSA) step using block copolymer (BCP) materials. These materials self-organize into regular structures with hexagonal (or square) symmetry and an equilibrium pitch $L_O$.

For application in a disk-drive recording system, however, these regular patterns bend in a circular symmetry. One way to accomplished this is by providing a guiding structure that contorts the local symmetry. For instance, it is possible to stretch the down-track pitch to ensure a fixed number of dots for a full circumference. At least within a single recording zone I spanning from an inner-radius R (ID,i) to an outer-radius R(OD,i), allows individual island addressability. At the zone transitions, the number of dots per circumference can be reset to maintain a quasi-constant areal density across the stroke.

The current island pattern for 1 Teradot per square inch and beyond have a zoned areal density design, with down-track pitch stretching about 5% within each zone to maintain constant number of dots for the circumference. Skew is set to zero in the current designs, such as not to stress the self-assembly process. The track-density is kept constant, or potentially can be made to follow a standard cos(skew-angle) relation to match the skew of the recording head as it pivots from the ID to the OD radius. The 5% top of a range and no skew capability are major constraints for the overall system design.

To improve the robustness of the self-assembly process, it is pertinent to reduce the stress on the materials system. Stress on the materials system is caused by two causes: (a) deviation from a perfectly symmetric pattern, e.g., by shearing or stretching, and (b) a change in the volume of the unit-cell through the Young modulus of the materials.

The current pattern designs incur both stressors as a result of the build-in down-track stretch with (near) constant cross-track pitch. However, the second stressor can be avoided by appropriately choosing the cross-track pitch to maintain a constant unit-cell volume. The net result is that the cross-track pitch reduces gradually within each recording zone as the down-track pitch gets stretched to accommodate the constant number of islands per circumference. The change in the cross-track pitch is predetermined to correspond to the same zone range used for down-track stretching, which in one embodiment for example is set to 5%. This relatively small range of cross-track pitch can be accommodated by the recording head. A reset of the cross-track pitch is again performed at the zone boundaries in conjunction with the reset of the down-track pitch of one embodiment.

Figure 10:
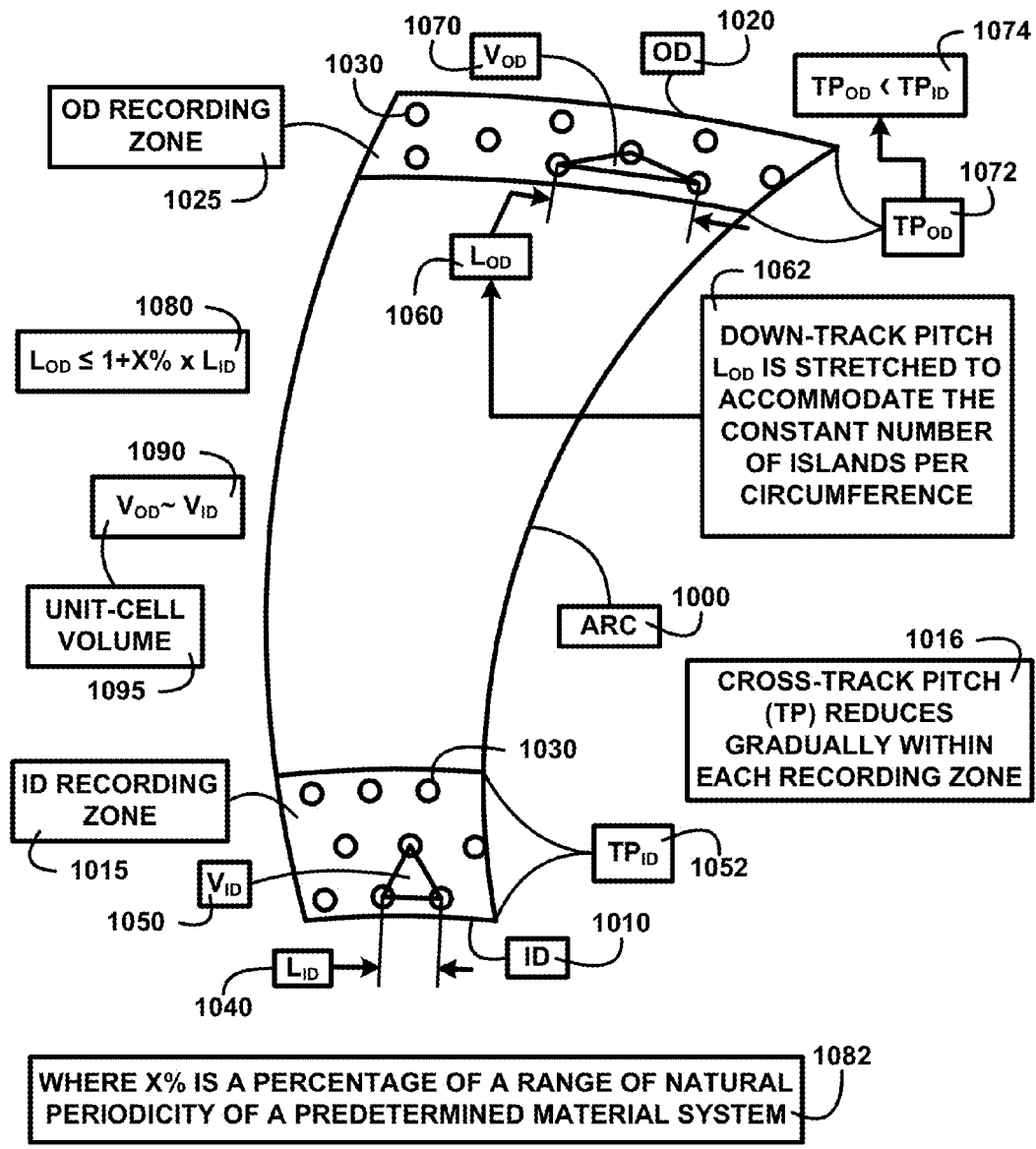
FIG. 10 shows for illustrative purposes only a zone example of down-track pitch stretching of one embodiment.

FIG. 10 shows for illustrative purposes only a zone example of down-track pitch stretching of one embodiment. FIG. 10 shows an arc 1000 on a disk aligned with the movement of a recording head. Shown is an ID 1010 the inner diameter of a recording zone 1015. Also shown is an OD 1020 the outer diameter of the recording zone 1025. At the inner and outer boundaries of the recording zones a reset of the down-track pitch is made. Cross-track pitch (TP) reduces gradually within each recording zone 1016 including $TP_{ID}$ 1052 and $TP_{OD}$ 1072 where $TP_{OD} < TP_{ID}$ 1074. A down-track pitch $L_{OD}$ is stretched to accommodate the constant number of islands per circumference 1062. The accommodation is shown with $L_{ID}$ 1040 and $L_{OD}$ 1060 where $L_{OD} \leq 1+X\% \times L_{ID}$ 1080, where X % is a percentage of a range of natural periodicity of a predetermined material system 1082. The coordinated constant unit-cell volume of the guiding patterns is shown with a unit-cell volume 1095 $V_{ID}$ 1050 and $V_{OD}$ 1070 where $V_{OD} \sim V_{ID}$ 1090 of one embodiment.

Figure 11:
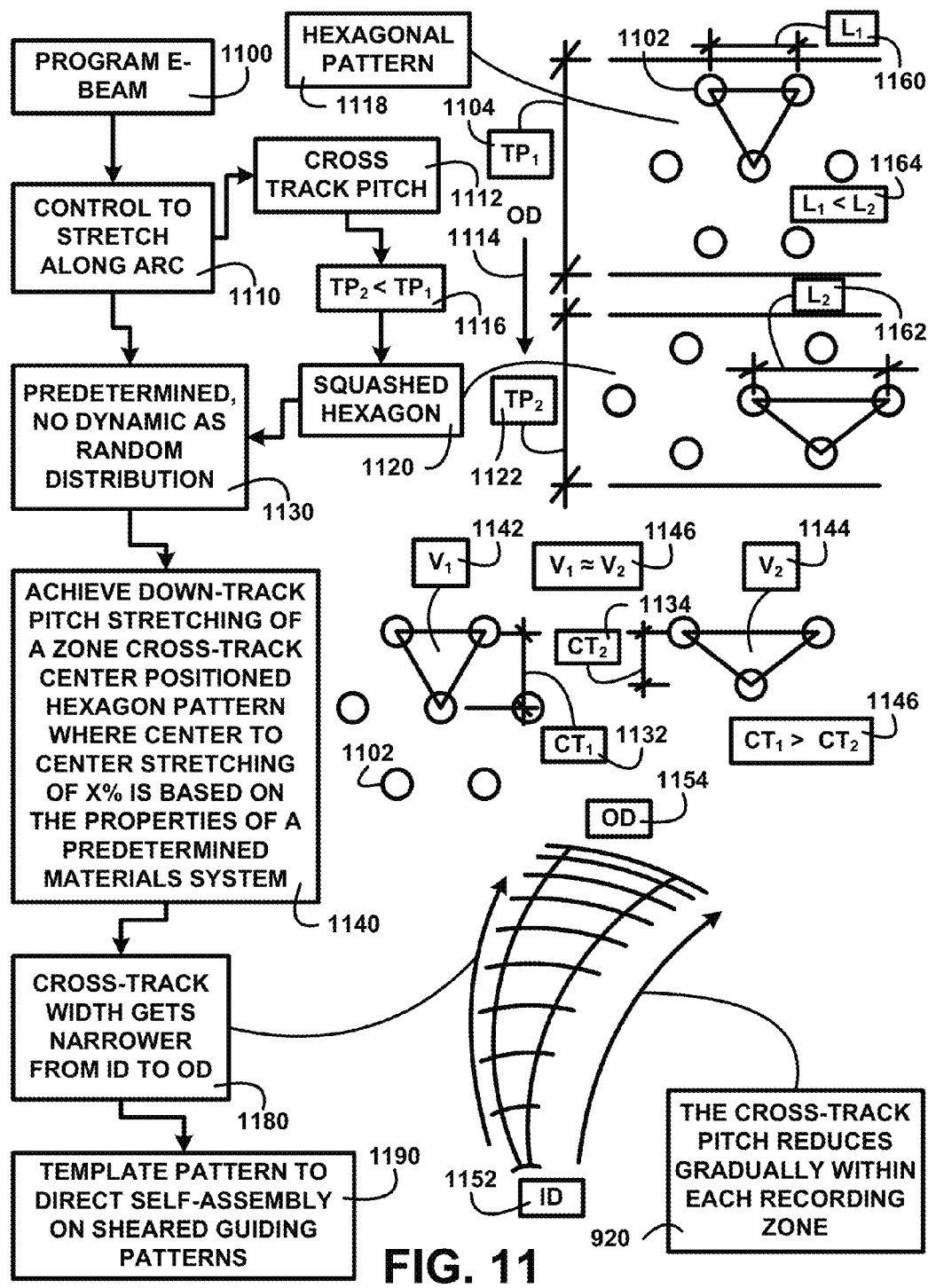
FIG. 11 shows for illustrative purposes only an example of cross-track pitch gradual reduction of one embodiment.

FIG. 11 shows for illustrative purposes only an example of cross-track pitch gradual reduction of one embodiment. FIG. 11 shows a program control to stretch along arc to achieve a cross-track pitch that reduces gradually. The program control is used to program e-beam 1100 functions to create guiding patterns that predetermine the stretch of the down-track spacing and gradual compression of cross-track spacing to maintain a constant unit-cell volume.

The program control is used to control to stretch along arc 1110 for example the down-track stretch of a hexagonal feature 1102. The program control coordinates the cross-track pitch 1112 with the down-track stretch. The coordination is shown with $TP_1$ 1104 at for example the ID 1152 and the narrowing for example at the OD 1114 with $TP_2$ 1122 where $TP_2 < TP_1$ 1116. The corresponding down-track stretch is shown with $L_1$ 1160 and $L_2$ 1162 where $L_1 < L_2$ 1164.

The combined narrowing of the cross-track pitch and lengthening down-track stretch forms a flattened hexagon 1120 as compared with a hexagonal pattern 1118. For example, in a zone with 3 cross-track sets of hexagonal features the hexagon pattern in the middle position in the zone can be a balanced application of cross-track pitch radial stretching and down-track stretching corresponding the range of distances of a non-stressed natural periodicity of the self-assembly for a particular block-copolymer materials system. The unit-cell volume established within the hexagon pattern in the middle position in the zone is maintained in the remaining inner and outer zone cross-track sets of hexagonal features.

The inner hexagonal pattern would have less down-track stretching due to a lesser circumference and a greater cross-track stretching due to a closer position to the ID of the disk relative to the middle position hexagon pattern. The distances of the lesser down-track stretching and greater cross-track stretching corresponding to the range of distances of the natural periodicity of the particular block-copolymer materials system are predetermined to maintain a zone unit-cell volume.

The third and outermost hexagonal pattern in the zone would have within the zone the greatest down-track stretching since its position has a greater circumference and a lesser cross-track stretch as it is further from the ID of the disk relative to the middle position stretching. The distances of the greater down-track stretching and lesser cross-track stretching corresponding to the range of distances of the natural periodicity of the particular block-copolymer materials system are predetermined to maintain the zone unit-cell volume.

The program control is used to control the spacing in a process that is predetermined, not dynamic, to avoid the random distribution which occurs when stressed materials self-assemble using random and non-coordinated guiding patterns which leads to the defects. In one embodiment the predetermination of the stretching is controlled to create a non-stressed pitch at center of the zone then compress and stretch in ID and OD directions respectively within the same zone. A predetermined diblock copolymer is used to achieve down-track pitch stretching of a zone cross-track center positioned hexagon pattern where center to center stretching of X % is based on the properties of a predetermined materials system 1140 including the predetermined diblock copolymer.

The subsequent compressing and stretching in ID and OD directions is predetermined to correspond to the stretching of X % of the properties of the predetermined diblock copolymer. The predetermined gradual reductions in the cross-track width are reset from zone to zone moving outward towards the outer diameter of the disk correspond to the X % of the properties of the predetermined diblock copolymer including the range of distances of the natural periodicity of the particular block-copolymer materials system.

The controlled predetermination of gradual reductions in the cross-track width and down-track stretching corresponding to the natural periodicity maintain a consistent zone unit-cell volume without stressing the material system. The controlled predetermination of gradual reductions in the cross-track width creates a range of cross-track pitch that can be accommodated by the recording head. At the same time within a single recording zone spanning from an inner-radius to an outer-radius individual island addressability is maintained while creating a quasi-constant areal density across the stroke.

The predetermined reset of cross-track width from zone to zone at the zone transitions is configured to eliminate stress on the predetermined material system. The elimination of stress on the predetermined material system avoids random distribution. The coordinated sheared guiding patterns with and consistent zone unit-cell volumes maintain individual island addressability thereby reducing read/write errors.

The controlled coordinated sheared guiding patterns develop constant unit-cell volumes as shown in $V_1$ 1142 and $V_2$ 1144 where even when the patterns transition into the flattened hexagon 1120 $V_1 \approx V_2$ 1146, the unit-cell volume is constant. The accommodation of the stretching is shown with $CT_1$ 1132 and $CT_2$ 1134 where $CT_1 > CT_2$ 1146. Cross-track width gets narrower from ID to OD 1180. From the ID 1152 to the OD 1154 the template pattern to direct self-assembly on sheared guiding patterns 1190 is controlled so that the cross-track pitch reduces gradually within each recording zone 920 of one embodiment.

Figure 12:
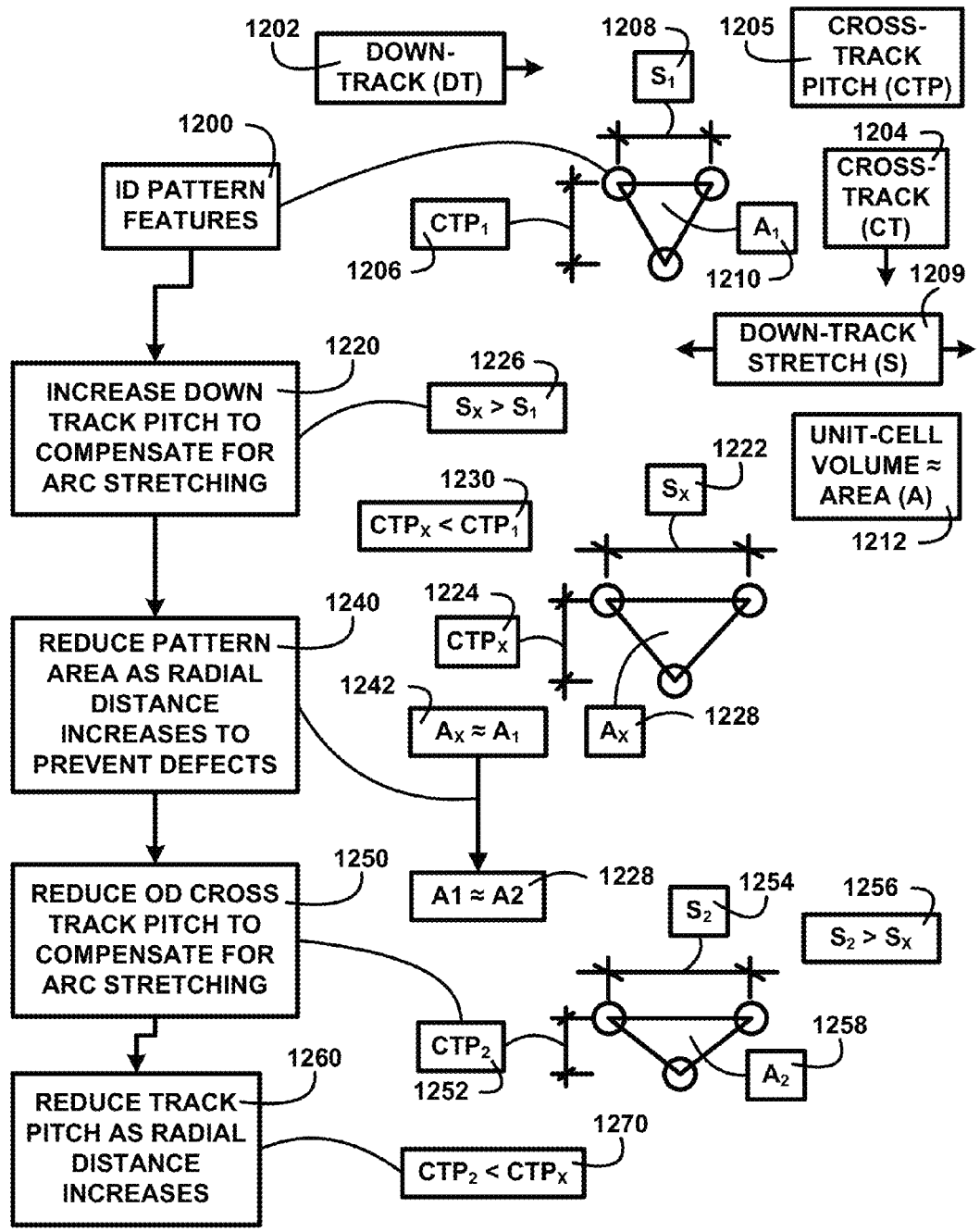
FIG. 12 shows for illustrative purposes only an example of constant unit-cell volume of one embodiment.

FIG. 12 shows for illustrative purposes only an example of constant unit-cell volume of one embodiment. FIG. 12 shows ID pattern features 1200. The ID pattern features 1200 are patterned with alignments to a down-track (DT) 1202 direction and a cross-track (CT) 1204 direction. The distance in a cross-track pitch (CTP) 1205 is predetermined. A distance for example $CTP_1$ 1206 in the cross-track (CT) 1204 direction is represented as a track pitch TP. The distance of $CTP_1$ 1206 is related to a distance $S_1$ 1208 which is a down-track stretch (S) 1209. $S_1$ 1208 is a stretch distance represented by the down-track pitch Lo. Both distances or lengths of $CTP_1$ 1206 and $S_1$ 1208 are predetermined using the control program.

The predetermined distances establish an area $A_1$ 1210. $A_1$ 1210 is an area measurement represented by the unit-cell volume Vo where unit-cell volume≈area (A) 1212. The predetermined distances are used to calculate the area where $A = \frac{1}{2} \times CTP \times S$. The S distance is adjusted to increase down-track pitch to compensate for arc stretching 1220. From the inner diameter to the outer diameter for each track $CTP_x$ 1224 is determined where $CTP_x < CTP_1$ 1230. Correspondingly using the control program $S_x$ 1222 is determined where $S_x > S_1$ 1226.

The corresponding predetermined distances establish the area for the features in that track $A_x$ 1228 where $A_x \approx A_1$ 1242. The gradual increase in stretching of the S value is coordinated with a decrease in the CTP value so that unit-cell volume is a predetermined value that is constant. The coordination of the adjustments in the cross-track and down-track pitch is made otherwise the area A would increase with the radial distance increase from the inner diameter. Corresponding increases in S along with decreases in CTP reduce pattern area as radial distance increases to prevent defects 1240. The control is used to reduce OD cross-track pitch to compensate for arc stretching 1250. At the OD $CTP_2$ 1252 is adjusted to reduce track pitch as radial distance increases 1260 where $CTP_2 < CTP_x$ 1270. $S_2$ 1254 is coordinated so that $S_2 > S_x$ 1256, thereby $A_2$ 1258 maintains a constant area measurement where $A_1 \approx A_2$ 1228. Uncontrolled patterning defects are transferred into the magnetic features thereby reducing quality. The predetermined sheared guiding pattern using the control program to maintain a constant unit-cell volume prevents stress in the patterning materials used to prevent defects from developing due to uncontrolled self-assembly of one embodiment.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method, comprising:
   depositing a resist layer using a mixture of several different length polymer strings materials spanning a range of natural periodicity; and
   imprinting the mixture of several different length polymer strings materials using sheared guiding patterns to increase flexibility, wherein
   the sheared guiding patterns include a first pattern at an inner diameter and a second pattern at an outer diameter,
   the first pattern includes a larger cross track pitch than the second pattern,
   the first pattern includes a narrower down track pitch than the second pattern, and a volume of the first pattern is equal to a volume of the second pattern.

2. The method of claim 1, wherein the several different length polymer strings materials include a non-monodispersity of block-copolymer mixtures, and
further comprising creating poly-dispersity using the non-monodispersity of block-copolymer mixtures.

3. The method of claim 1, further comprising creating square feature patterns and hexagonal feature patterns with a BCP directed self-assembly of the mixture of several different length polymer strings materials.

4. The method of claim 1, further comprising creating sphere or cylinder features with the mixture of several different length polymer strings materials.

5. The method of claim 1, further comprising, with the different length polymer strings, skewing of dot feature spacing with respect to natural periodicity ($L_O$) at a value of $0.95\,L_O$ to $1.10\,L_O$.

6. The method of claim 1,
wherein the sheared guiding patterns include features, and
further comprising changing a spacing between the features from +/−5% to 10% from track to track.

7. The method of claim 1, wherein
the sheared guiding patterns include sphere or cylinder features, and
a pitch of the sphere or cylinder features is greater in a track than an adjacent inner track.

8. The method of claim 1, wherein
the sheared guiding patterns include sphere or cylinder features, and
the sphere or cylinder features is a constant number across-tracks and in a cross track direction.

9. The method of claim 1, further comprising stretching a spacing of features within the sheared guiding patterns along track and down-track in a range of +/−5% to 10% including where $X_1L_O=1L_O\times1.05$; $X_2L_O=X_1L_O\times1.05$; and $X_3L_O=X_2L_O\times1.05$ and $X_NL_O=1L_O\times1.05^{\wedge N}$.

10. The method of claim 1, further comprising skewing and stretching a down-track spacing of features within the sheared guiding patterns to accommodate a bend in a circular symmetry for a recording head pivoting in a range of −15% to −18% to +15% to +18% of change.

* * * * *